(12) United States Patent
Meadowcroft et al.

(10) Patent No.: US 9,435,966 B2
(45) Date of Patent: Sep. 6, 2016

(54) LENS DEVICE ATTACHMENT TO PRINTED CIRCUIT BOARD

(71) Applicants: David J. K. Meadowcroft, San Jose, CA (US); Paul Yu, Mountain View, CA (US)

(72) Inventors: David J. K. Meadowcroft, San Jose, CA (US); Paul Yu, Mountain View, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/714,672

(22) Filed: May 18, 2015

(65) Prior Publication Data

US 2015/0253522 A1 Sep. 10, 2015

Related U.S. Application Data

(62) Division of application No. 13/036,572, filed on Feb. 28, 2011, now Pat. No. 9,066,456.

(51) Int. Cl.
*G02B 6/36* (2006.01)
*G02B 6/42* (2006.01)
*H05K 1/02* (2006.01)
*H05K 3/30* (2006.01)
*G02B 6/12* (2006.01)

(52) U.S. Cl.
CPC ......... *G02B 6/4244* (2013.01); *G02B 6/12004* (2013.01); *G02B 6/4214* (2013.01); *G02B 6/4226* (2013.01); *G02B 6/4237* (2013.01); *G02B 6/4257* (2013.01); *H05K 1/0269* (2013.01); *H05K 1/0274* (2013.01); *H05K 3/303* (2013.01); *H05K 2201/09918* (2013.01); *H05K 2201/10121* (2013.01); *H05K 2203/1305* (2013.01); *H05K 2203/1327* (2013.01); *Y02P 70/613* (2015.11); *Y10T 29/4913* (2015.01)

(58) Field of Classification Search
None
See application file for complete search history.

(56) References Cited

U.S. PATENT DOCUMENTS

| 7,264,408 | B2 | 9/2007 | Togami et al. |
| 7,534,988 | B2 | 5/2009 | Kong et al. |
| 2004/0028349 | A1 | 2/2004 | Nagasaka et al. |
| 2004/0264887 | A1 | 12/2004 | Rosenberg et al. |
| 2006/0093305 | A1 | 5/2006 | Lim et al. |
| 2006/0274997 | A1* | 12/2006 | Furuno et al. ............... 385/89 |
| 2006/0274999 | A1* | 12/2006 | Wu et al. ...................... 385/92 |

FOREIGN PATENT DOCUMENTS

| JP | 9197197 | | 7/1997 |
| JP | 2001174671 | A | 6/2001 |
| JP | 2008107760 | A | 5/2008 |
| WO | WO2010143175 | A1 | 12/2010 |

* cited by examiner

*Primary Examiner* — Uyen Chau N Le
*Assistant Examiner* — Chad Smith (57) ABSTRACT

An optical assembly can be formed by providing a frame made of a plastic material on a surface of a printed circuit board (PCB), mounting at least one opto-electronic element on the surface of the PCB within the frame, and laser-welding a lens device onto the frame.

20 Claims, 7 Drawing Sheets

LENS DEVICE ATTACHMENT TO PRINTED CIRCUIT BOARD

CROSS-REFERENCE TO RELATED APPLICATIONS

This application is a divisional of U.S. patent application Ser. No. 13/036,572, filed on Feb. 28, 2011, entitled LENS DEVICE ATTACHMENT TO PRINTED CIRCUIT BOARD," which is currently pending and which is incorporated by reference herein in its entirety.

BACKGROUND

An optical communication system transmits information encoded in optical (light) signals from an optical transmitter to an optical receiver over one or more optical fibers. An optical transmitter commonly includes a light source, such as a laser or light-emitting diode, as well as optical and mechanical elements for coupling the light source to an optical fiber. Similarly, an optical receiver commonly includes a light receiver, such as a photodiode, as well as optical and mechanical elements for coupling the light receiver to an optical fiber. The optical elements commonly include lenses and may also include mirrors or similar reflective elements that redirect the optical paths.

Optical transmitters and receivers are commonly modularized to facilitate coupling to the fiber and to the systems with which optical signals are to be communicated. An optical transmitter or receiver module commonly includes a housing, which may be sealed to inhibit contamination of optical paths by dust or similar airborne matter. The housing may include a port to which the end of an optical fiber can be coupled. Optical transceiver modules that include both an optical transmitter and optical receiver are well known and exist in a number of different form factors. In some optical communication modules, lenses or other optical elements are unitarily molded along with other portions of the housing, which may be made of an optically transparent plastic material.

Figure 1A:
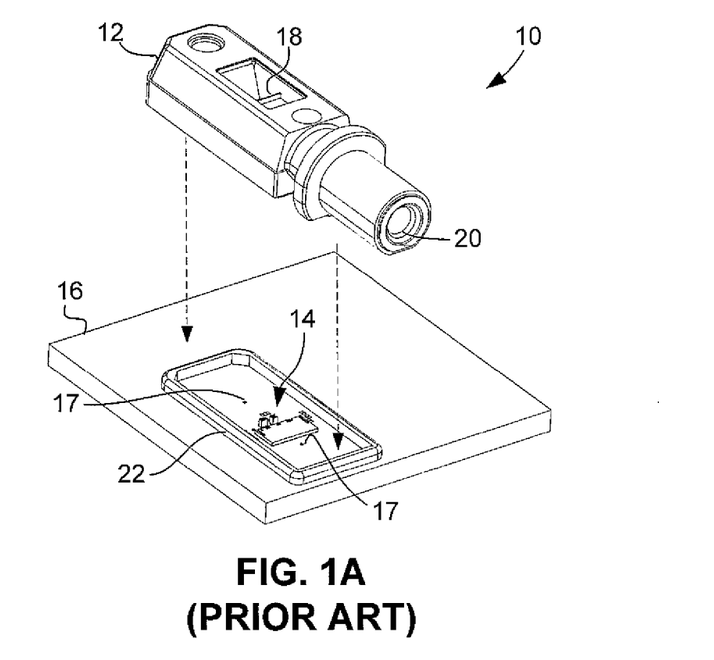
FIG. 1A is a top perspective view of an optical assembly known in the prior art, showing the optical assembly prior to mounting a lens device on a frame.

As illustrated in FIG. 1A, it is known to form an optical assembly 10 by a method that includes placing a lens device 12 over one or more opto-electronic and electronic devices 14 mounted on a surface of a printed circuit board (PCB) 16. Devices 14, which can include, for example, a vertical cavity surface-emitting laser (VCSEL) or a photodiode, and an associated integrated circuit chip, can first be mounted on the surface of PCB 16. A robotic pick-and-place machine (not shown) may align the VCSEL or photodiode on PCB 16 with respect to fiducial markings 17 that are sensed through a machine-vision feedback system. The alignment tolerance achieved by the pick-and-place machine is commonly on the order of tens of microns.

Figure 1B:
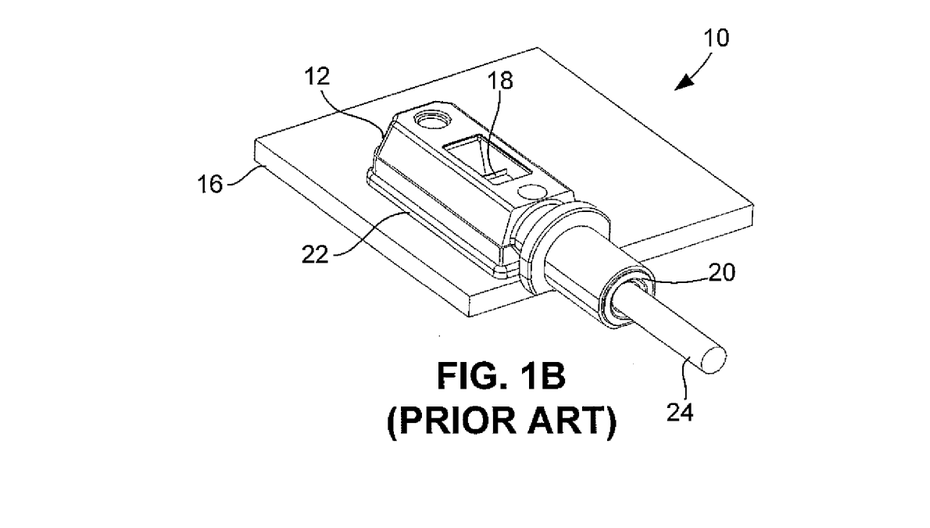
FIG. 1B is similar to FIG. 1, showing the optical assembly after the lens device has been mounted on the frame.

Lens device 12 includes a reflector 18 and other optical elements that redirect light at a 90-degree angle between the VCSEL and an optical fiber port 20. After lens device 12 is placed over devices 14, the optical paths are precisely aligned using an active alignment method. In the active alignment method, light is introduced (by external equipment, not shown) through optical fiber port 20, and the amplitude of the electronic signal produced by one of opto-electronic devices 14 in response to the light is monitored (by external equipment, not shown) as lens device 12 is moved about the plane parallel to the surface of PCB 16 in small increments. When the measured amplitude is a maximum, the movement of lens device 12 is halted at the corresponding position, and lens device 12 is secured at that position to the surface of PCB 16. As shown in FIG. 1B, lens device 12 can be secured by applying epoxy 22 between the base of lens device 12 and the surface of PCB 16. Although epoxy 22 is depicted in FIG. 1A for purposes of illustration as a rectangular bead on which lens device 12 can be placed, small dots of UV-curable epoxy (not shown) may instead be used to initially tack lens device 12 to PCB 16. A bead of structural epoxy is then applied around the perimeter after the initial tack bonds have been UV-cured. The assembly then may be placed in an oven to cure the bead of structural epoxy. An end of an optical fiber 24 is shown coupled to port 20 in FIG. 1B.

A disadvantage of the above-described method of forming optical assembly 10 is that the active alignment and epoxy curing steps take significant amounts of time, thereby potentially impacting manufacturing throughput (i.e., units per hour produced). Another disadvantage of the above-described method is that performing active alignment and dispensing the epoxy are commonly performed manually, i.e., under direct control of a person, which can result in a greater percentage of defective assemblies (i.e., lower manufacturing yield) than a more automated method. It is common, for example, for elements of lens assembly 10 to drift out of optical alignment with one another while the epoxy cures. A method of forming an optical assembly that maximizes throughput and yield would be desirable.

SUMMARY

Embodiments of the present invention relate to an optical assembly having a laser-welded lens device and a method for making or forming such an optical assembly. In an illustrative or exemplary embodiment, the optical assembly can be formed by providing a frame made of a plastic material on a surface of a printed circuit board (PCB), mounting at least one opto-electronic element on the surface of the PCB within the frame, and laser-welding a lens device onto the frame. The lens device can be made of an optically transparent material that allows the beam of a laser welding tool to penetrate to the weld line between the lens device and frame. The opto-electronic element can comprise, for example, a light source such as a laser or a light detector such as a photodiode. The method can include using the same fiducials that are used to align the opto-electronic element with respect to the PCB to align the lens device with respect to the PCB.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The devices in the drawings are not necessarily to scale, emphasis instead being placed upon clearly illustrating the principles of the present invention.

DETAILED DESCRIPTION

Figure 2:
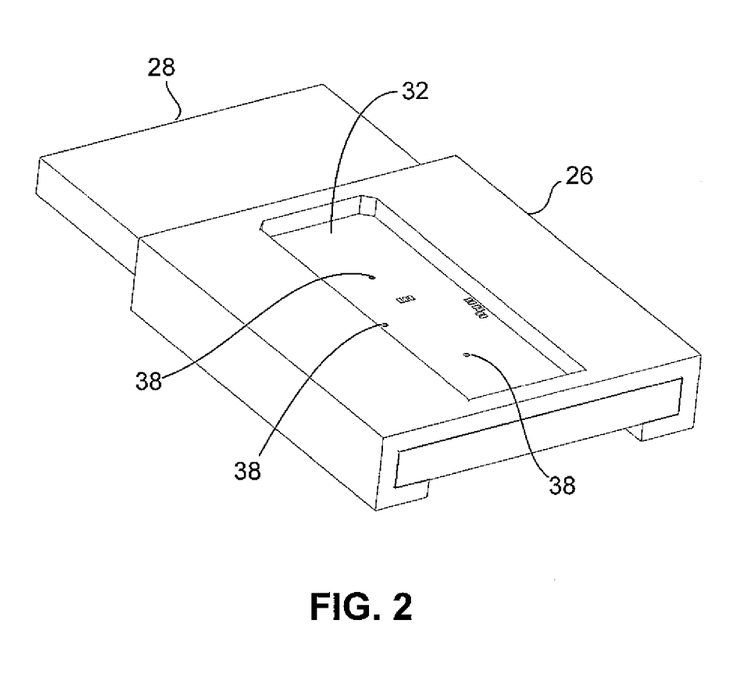
FIG. 2 is a top perspective view of a frame mounted on a printed circuit board (PCB), in accordance with an exemplary embodiment of the present invention.
Figure 4:
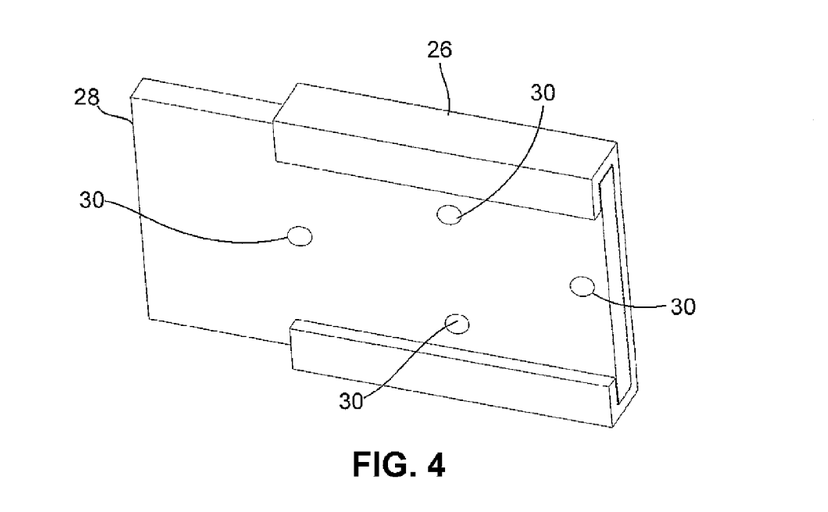
FIG. 4 is a bottom perspective view of the frame and printed circuit board of FIGS. 2-3.

As illustrated in FIG. 2, in an illustrative or exemplary embodiment of the invention, a frame 26 is provided on a top surface of a printed circuit board (PCB) 28. Frame 26 is made of a plastic material that can be laser-welded to another plastic element in the manner described below. Frame 26 can be provided on the surface of PCB 28 in any suitable manner. For example, frame 26 can be overmolded on the top surface PCB 28. As well understood in the art, overmolding is a method in which a mold (not shown) is placed against another element (in this instance, PCB 28) and a moldable material such as a thermoplastic is injected into the mold. The mold is then removed, leaving frame 26 on PCB 28. Alternatively, for example, frame 26 can be formed apart from PCB 28 and then placed on the top surface of PCB 28. In the exemplary embodiment, frame 26 is generally rectangular in shape, with a C-shaped profile, and has end portions that extend partially around the sides of PCB 28 to the bottom surface of PCB 28 to help secure frame 26 to PCB 28. Nevertheless, in other embodiments of the invention such a frame can have any other suitable shape and need not have portions that extend onto the bottom surface of the PCB. In the exemplary embodiment, frame 26 includes protuberances or bosses 30 that extend through holes in PCB 28 and have ends that are heat-staked at the bottom surface of PCB 28 to further help secure frame 26 to PCB 28, as illustrated in FIG. 4. Note that in the exemplary embodiment, frame 26 has an interior region 32 with a generally rectangular perimeter, and a portion of PCB 28 is exposed through interior region 32.

Figure 3:
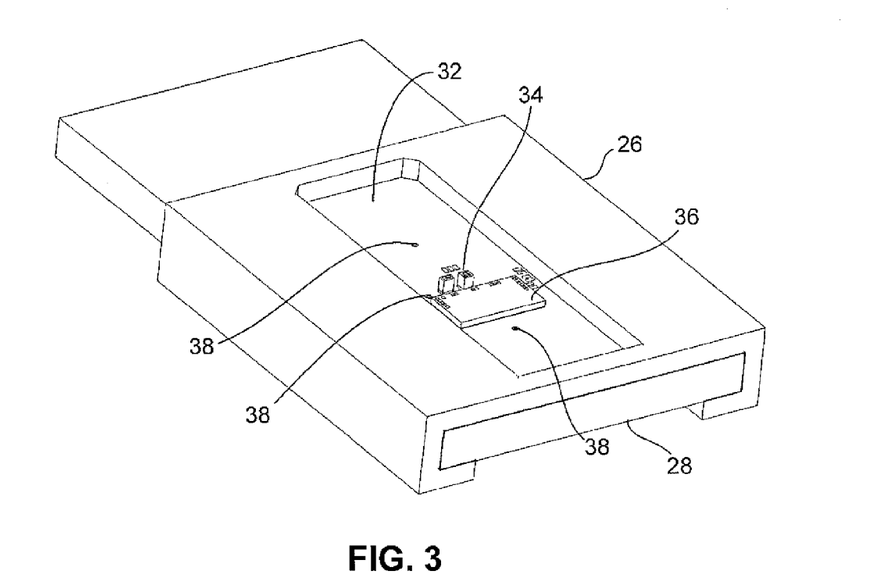
FIG. 3 is similar to FIG. 2, showing devices mounted on the PCB within the frame.

As illustrated in FIG. 3, one or more opto-electronic devices 34 and electronic devices 36 can be mounted on the portion of PCB 28 that is exposed through interior region 32 of frame 26. Opto-electronic devices 34 can include, for example, a light source such as a vertical cavity surface-emitting laser (VCSEL), or a light detector such as a photodiode. Electronic devices 36 can include one or more integrated circuit chips that process electrical signals that are provided to and received from opto-electronic devices 34. Fiducials 38, which are visually perceptible markings on the top surface of PCB 28 within the exposed portion, can aid alignment of devices 34 and 36 with respect to PCB 28.

Opto-electronic devices 34 and electronic devices 36 can be mounted using a conventional pick-and-place machine 54 (FIG. 9) that aligns devices 34 and 36 with respect to fiducials 38. As well understood in the art, pick-and-place machine 54 is a robotic system that can pick up surface-mount devices from a parts feeder and place them on the surface of a PCB, where they can be electrically connected to conductive traces on the PCB by reflow soldering or a similar process. Pick-and-place machine 54 can include a conventional machine-vision feedback system that can optically sense fiducials 38 and place devices 34 and 36 using fiducials 38 as a frame of reference. As the manner in which such a pick-and-place machine 54 operates is well understood in the art, this aspect of the method is not described in further detail herein. Wirebonds or similar conductors that electrically interconnect devices 34 and 36 with each other or with conductive pads on PCB 28 are not shown for purposes of clarity.

Figure 5:
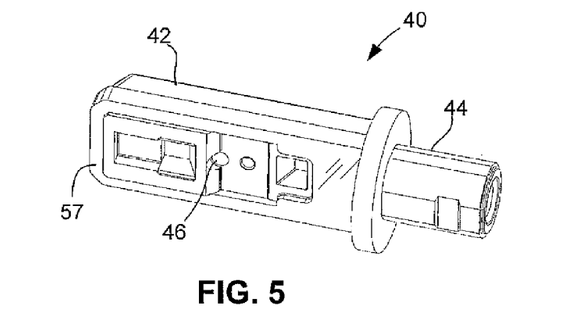
FIG. 5 is a bottom perspective view of the lens device.
Figure 6:
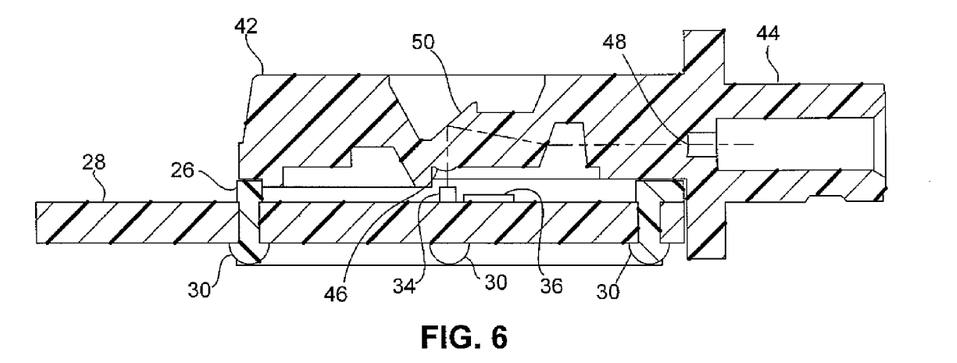
FIG. 6 is a sectional view taken on line 6-6 of FIG. 8.
Figure 8:
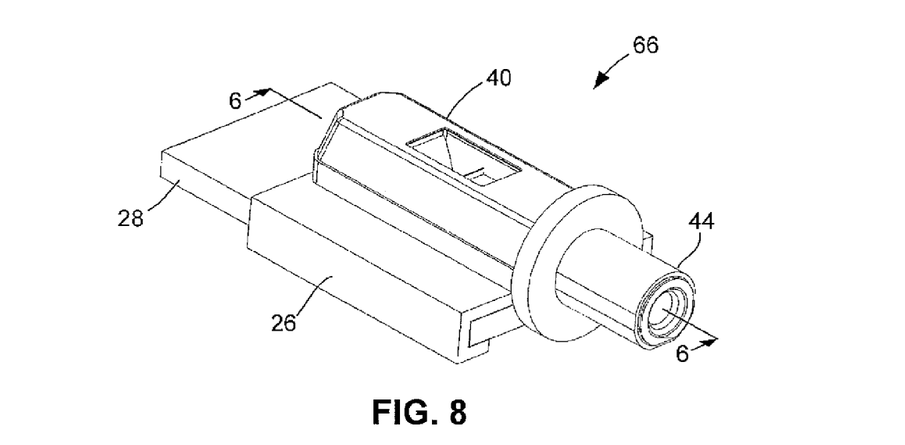
FIG. 8 is similar to FIG. 7, showing the optical assembly after the lens device has been mounted on the frame.

As illustrated in FIGS. 5-6, a lens device 40 includes a body portion 42 and a fiber port portion 44. As described below, lens device 40 can be laser-welded to frame 26. Lens device 40 can include optical elements that are interposed in the optical path between opto-electronic device 34 and fiber port portion 44 when lens device 40 is mounted on frame 26 (FIG. 8). Such optical elements can include, for example, a first lens 46, a second lens 48 and a reflector 50. When lens device 40 is mounted on frame 26 (FIGS. 6 and 8), an optical signal can be transmitted or received through a fiber coupled to fiber port portion 44. The optical signal is redirected by reflector 50 and other optics at a 90-degree angle between the optical axis of fiber port portion 44 and the optical axis of opto-electronic device 34. These optical axes are indicated in broken line in FIG. 6.

Lens device 40 can be made of a material that is transparent to the optical signals emitted by or received by opto-electronic device 34. An example of such material is available under the brand name ULTEM (e.g., ULTEM 1010), which is an amorphous thermoplastic material produced by SABIC Innovative Plastics of Saudi Arabia (formerly General Electric Plastics Division). As lens device 40 is made of an optically transparent material, first and second lenses 46 and 48 can be defined by portions of lens device 40 that are unitarily molded with the surrounding portions of lens device 40.

Figure 7:
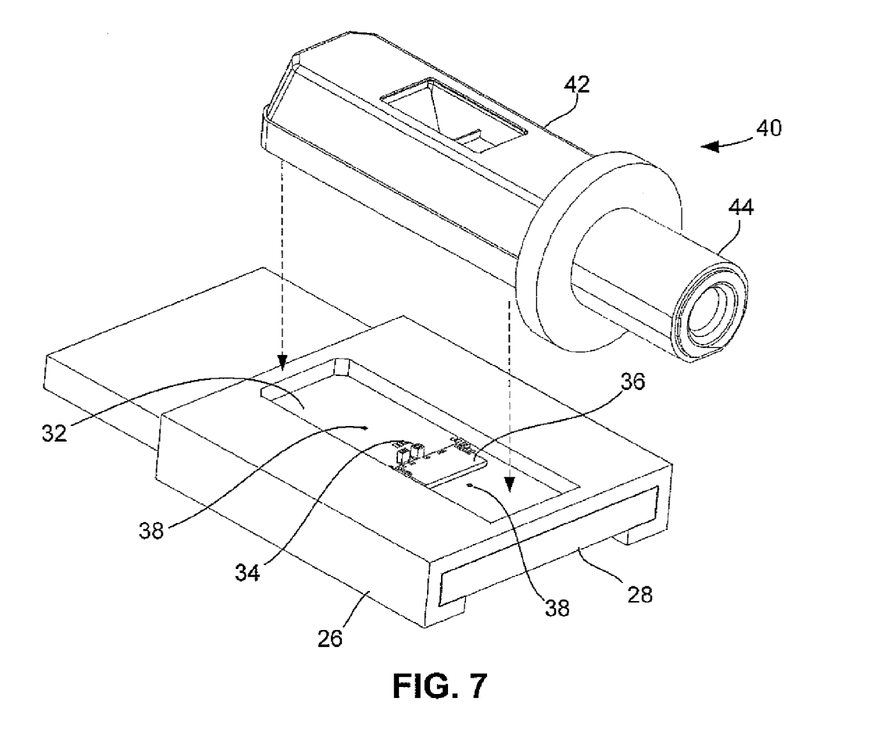
FIG. 7 is a top perspective view, illustrating the mounting of the lens device on the frame and printed circuit board of FIGS. 2-4.
Figure 9:
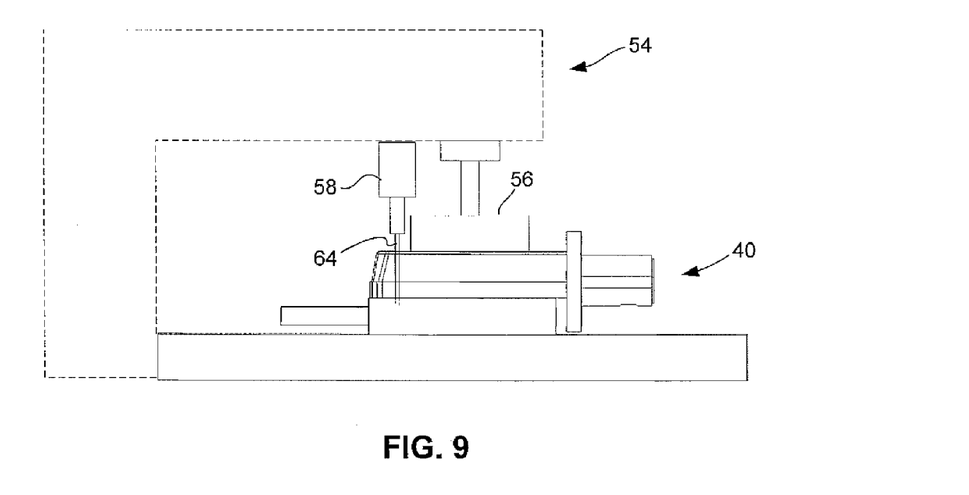
FIG. 9 is a side elevation view showing a pick-and-place machine with a laser welding tool forming a weld between the lens device and the frame of the optical assembly.

As illustrated in generalized form in FIG. 9, pick-and-place machine 54 has a robotic mechanism 56 that can pick up lens device 40 from a feeder that feeds such lens devices 40 from a storage location where they are stored in bulk (not shown). Although some conventional pick-and-place machines can pick up several devices at a time, only one lens device 40 is shown for purposes of clarity. Pick-and-place machine 54 then uses robotic mechanism 56 to place lens device 40 on top of frame 26 (FIGS. 7-8). More specifically, lens device 40 is placed in an orientation in which a flat base portion 57 (FIG. 5) of lens device 40 rests against the correspondingly flat upper surface of frame 26. (Although in the exemplary embodiment the mating surfaces of base portion 57 and frame 26 are flat or planar, in other embodiments they can have any correspondingly mating shapes or contours.) Pick-and-place machine 54 aligns lens device 40 with fiducials 38 in substantially the same manner as described above with regard to the alignment of devices 34 and 36 to fiducials 38. Thus, as both lens device 40 and opto-electronic device 34 are aligned with respect to the same fiducials 38, lens device 40 and opto-electronic device 34 are inherently aligned with respect to each other. Using the same pick-and-place machine 54 to align both lens device 40 and opto-electronic device 34 can promote alignment precision, since the assembly does not need to be moved from one machine to another.

Figure 10:
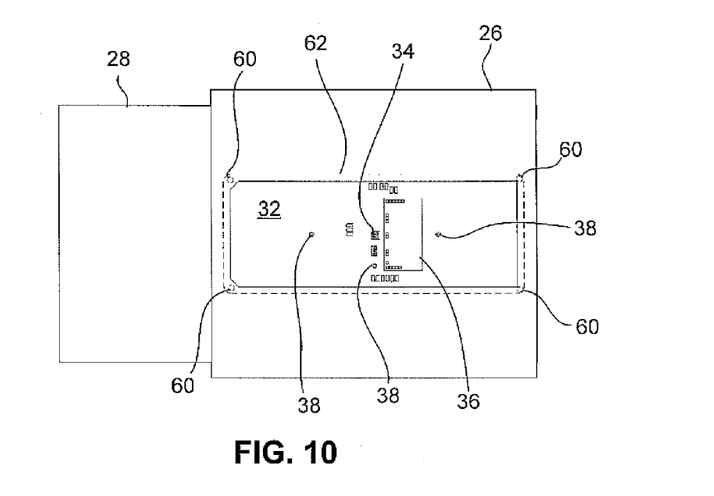
FIG. 10 is a top plan view of the optical assembly of FIG. 9, with the lens device not shown to reveal the weld between the lens device and the frame.

The material of which lens device 40 is made is also transparent to the optical energy emitted by a laser welding tool. As shown in FIG. 9, pick-and-place machine 54 can be provided with such a laser welding tool 58. Laser welding tool 58 can be of a conventional type with which persons skilled in the art are familiar. As illustrated in FIGS. 9-10, pick-and-place machine 54 can cause laser welding tool 58 to form spot welds 60 at points around the perimeter of interior region 32, such as in the four corners, while robotic mechanism 56 holds lens device 40 in place at the above-referenced location to which lens device 40 has been aligned. That is, the laser beam 64 that is emitted by laser welding tool 58 impinges upon the points indicated as spot welds 60 in FIG. 10. In addition, or alternatively, pick-and-place machine 54 can cause laser welding tool 58 to trace a continuous path 62 with laser beam 64 around the perimeter of interior region 32 while robotic mechanism 56 holds lens device 40 in place at the above-referenced location to which lens device 40 has been aligned. For example, spot welds 60 can be formed initially to help secure lens device 40 in place, and then the continuous weld around path 62 can be formed to seal lens device 40 to frame 26. Holding lens device 40 in place during welding can help prevent lens device 40 from moving away from the location to which lens device 40 has been aligned until lens device 40 is secured in place by the welds.

During welding, laser beam 64 enters the upper portion of lens device 40, passes through lens device 40, and exits lens device 40 through base portion 57 (FIG. 5). The portion of laser beam 64 that exits through base portion 57 impinges upon the upper surface of frame 26 and forms a weld between base portion 57 and frame 26.

To facilitate welding, frame 26 can be made from a material that has properties similar to those of the material from which lens device 40 is made, as similar materials are generally more susceptible of welding to each other. For example, both lens device 40 and frame 26 can be made from ULTEM. Frame 26 can be made from a material that is more opaque to the energy of laser beam 64 than the material from which lens device 40 is made, so that laser beam 64 readily passes through lens device 40 but is absorbed by frame 26. The absorption of energy by frame 26 produces the heat that forms welds 60 and 62. For example, lens device 40 can be made of ULTEM 1010 with no additives, while frame 26 can be made of ULTEM 1010 with about one percent carbon black added to enhance energy absorption.

Although laser welding and the operation of welding tool 58 are well understood by persons skilled in the art, an example of welding parameters that may be useful to select include the power of laser beam 64, the spot size of laser beam 64, and the pressure with which robotic mechanism 56 holds lens device 40 in place during welding. A suitable beam power can be, for example, about 12 watts. A suitable beam spot size can be, for example, about 0.6 mm. A suitable pressure with which robotic mechanism 56 holds lens device 40 in place during welding can be, for example, about 0.9 bar. Nevertheless, persons skilled in the art to which the invention relates are readily capable of selecting such parameters and otherwise operating welding tool 58 in a manner that forms suitable welds 60 and 62.

Using the above-described method, the complete optical assembly 66 shown in FIG. 8 can be formed. Optical assembly 66 can be used in a conventional manner, such as by electrically connecting it to an external electronic information processing system (not shown) through electrical contacts (not shown) on PCB 28 and coupling an optical fiber (not shown) to fiber port portion 44. In operation, optical signals can be communicated between the optical fiber and opto-electronic device 34 along the path indicated in broken line in FIG. 6. Two such optical assemblies 66 can communicate optical signals with each other via the optical fiber, with one serving as a transmitter and the other as a receiver. In the transmitting optical assembly 66, opto-electronic device 34 is a laser or other light source, while in the receiving optical assembly 66, opto-electronic device 34 is a photodiode or other light detector.

Figure 11:
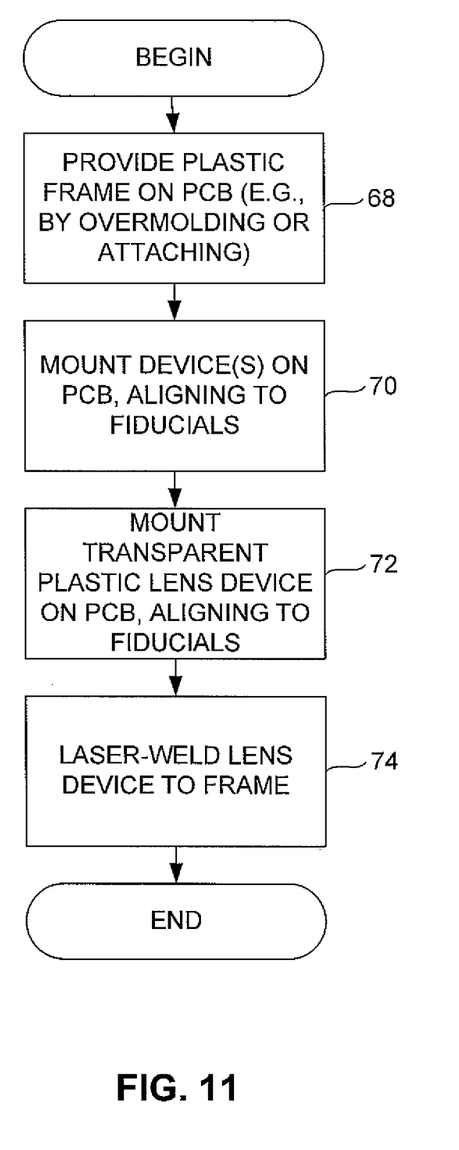
FIG. 11 is a flow diagram illustrating a method for forming the optical assembly, in accordance with an exemplary embodiment of the invention.

The method for forming an optical assembly (e.g., optical assembly 66) in accordance with embodiments of the present invention can be described with regard to FIG. 11. As indicated by block 68, frame 26 can be provided on PCB 28 by overmolding it in place or, alternatively, by forming it separately and then placing it on PCB 28. As indicated by block 70, at least one opto-electronic device 34 can be mounted on the surface of PCB 28 within interior region 32 by aligning opto-electronic device 34 with fiducials 38. As indicated by block 72, lens device 40 can be mounted on frame 26 by aligning lens device 40 with the same fiducials 38. The same pick-and-place machine 54 can be used to align both opto-electronic device 34 and lens device 40. As indicated by block 74, lens device 40 can be laser-welded to frame 26 in the location to which lens device 40 was aligned.

One or more illustrative or exemplary embodiments of the invention have been described above. However, it is to be understood that the invention is defined by the appended claims and is not limited to the specific embodiments described.

What is claimed is:

1. An optical assembly, comprising:
   a printed circuit board (PCB);
   a frame made of a plastic material disposed on a surface of the PCB, the frame having a generally planar shape, an interior region, and a continuous perimeter with a flat surface extending in a plane around the interior region;
   at least one opto-electronic device mounted on the surface of the PCB within the interior region of the frame; and
   a lens device made of a plastic material, the lens device having a body portion and a fiber port portion, the fiber port portion being adapted to couple with an end of an optical fiber, the body portion being fused to the frame in alignment with the opto-electronic device, the body portion having an optics system disposed therein for coupling light between the end of the optical fiber and the opto-electronic device, the optic system comprising a reflector and a lens, a weld seam existing between the flat surface of the frame and a flat base of the body portion where the plastic material of the flat base of the body portion and the plastic material of the frame are fused together, the flat base of the body portion of the lens device contacting the flat surface of the frame, wherein contact between the flat base of the body portion of the lens device and the flat surface of the frame does not restrict planar movement of the lens device with respect to the frame absent the weld seam.

2. The optical assembly of claim 1, wherein the frame is mounted to the surface of the PCB.

3. The optical assembly of claim 1, wherein the frame is overmolded on the surface of the PCB.

4. The optical assembly of claim wherein the reflector defines a first optical path extending between the opto-electronic device and the reflector, and a second optical path extending between the reflector and the fiber port, the fiber port having an optical axis parallel to the surface of the PCB.

5. The optical assembly of claim 1, wherein:
a portion of the lens device extending from an exterior surface of the lens device to the flat base portion of the lens device is substantially transparent to laser-welding radiation; and
the flat surface of the frame is substantially opaque to laser-welding radiation.

6. The optical assembly of claim 1, wherein the frame has one or more bosses extending through the PCB and heat-staked to retain the frame against the surface of the PCB.

7. The optical assembly of claim 1, wherein the weld seam comprises a continuous weld following the perimeter of the frame.

8. The optical assembly of claim 7, wherein the weld seam further comprises a plurality of spot welds formed prior the continuous weld following the perimeter of the frame.

9. The optical assembly of claim 1, wherein the surface of the PCB has one or more optically detectable points of reference and the location of the opto-electronic device on the surface of the PCB is determined by one or more of the optically detectable points of reference.

10. The optical assembly of claim 9, wherein the alignment of the lens device with the opto-electronic device is determined by one or more of the optically detectable points of reference.

11. The optical assembly of claim 9, wherein the one or more optically detectable points of reference comprise one or more fiducials on the PCB.

12. An optical assembly, comprising:
a printed circuit board (PCB), the PCB having a surface containing one or more optically detectable points of reference;
a frame disposed on the surface of the PCB, the frame having a generally planar shape, an interior region, and a continuous perimeter with a flat surface extending in a plane around the interior region;
at least one opto-electronic device mounted on the surface of the PCB within the interior region of the frame, the location of the opto-electronic device on the surface of the PCB being based on alignment of the opto-electronic device with said one or more optically detectable points of reference; and
a lens device attached to the frame in alignment with the opto-electronic device, the alignment of the lens device with the opto-electronic device being based on alignment of the lens device with said one or more of the optically detectable points of reference,
wherein, the lens device contains at least one optical element for optically coupling an optical fiber to the opto-electronic device, a weld between the flat surface of the frame and a flat base portion of the lens device fuses the lens device and frame together after the lens device is in alignment such that the flat base portion of the lens device contacts the flat surface of the frame.

13. The optical assembly of claim 12, wherein said one or more optically detectable points of reference comprise one or more fiducials on the PCB.

14. The optical assembly of claim 12, wherein the lens device comprises a reflector, a lens, and a fiber port adapted to receive an end of an optical fiber.

15. The optical assembly of claim 14, wherein the reflector defines a first optical path extending between the opto-electronic device and the reflector, and a second optical path extending between the reflector and the fiber port, the fiber port having an optical axis parallel to the surface of the PCB.

16. The optical assembly of claim 12, wherein:
a portion of the lens device extending from an exterior surface of the lens device to the flat base portion of the lens device is substantially transparent to laser-welding radiation;
the flat surface of the frame is substantially opaque to laser-welding radiation;
and
the weld is disposed between the flat base portion of the lens device and the flat surface of the frame.

17. The optical assembly of claim 12, wherein the frame has one or more bosses extending through the PCB and heat-staked to retain the frame against the surface of the PCB.

18. The optical assembly of claim 12, wherein the weld comprises a continuous weld following the perimeter of the frame.

19. The optical assembly of claim 18, wherein the weld further comprises a plurality of spot welds formed prior the continuous weld following the perimeter of the frame.

20. An optical assembly, comprising:
a printed circuit board (PCB), a surface of the PCB having one or more optically detectable points of reference;
a frame made of a plastic material disposed on a surface of the PCB, the frame having a generally planar shape, an interior region, and a continuous perimeter with a flat surface extending in a plane around the interior region;
at least one opto-electronic device mounted on the surface of the PCB within the interior region of the frame, the location of the opto-electronic device on the surface of the PCB being determined by one or more of the optically detectable points of reference; and
a lens device made of a plastic material, the lens device having a body portion and a fiber port portion, the fiber port portion being adapted to couple with an end of an optical fiber, the body portion being fused to the frame in alignment with the opto-electronic device, the body portion having an optics system disposed therein for coupling light between the end of the optical fiber and the opto-electronic device, a weld seam existing between the flat surface of the frame and a flat base of the body portion where the plastic material of the flat base of the body portion and the plastic material of the frame are fused together, the flat base of the body portion of the lens device contacting the flat surface of the frame, wherein contact between the flat base of the body portion of the lens device and the flat surface of the frame does not restrict planar movement of the lens device with respect to the frame absent the weld seam.

* * * * *